United States Patent [19]

Merchant et al.

[11] Patent Number: 5,300,448
[45] Date of Patent: Apr. 5, 1994

[54] HIGH VOLTAGE THIN FILM TRANSISTOR HAVING A LINEAR DOPING PROFILE AND METHOD FOR MAKING

[75] Inventors: Steven L. Merchant, Yorktown Heights; Emil Arnold, Chappaqua, both of N.Y.

[73] Assignee: North American Philips Corporation, New York, N.Y.

[21] Appl. No.: 15,061

[22] Filed: Feb. 8, 1993

Related U.S. Application Data

[63] Continuation of Ser. No. 650,391, Feb. 1, 1991, abandoned.

[51] Int. Cl.$^5$ .......................................... H01C 21/266
[52] U.S. Cl. .................................. 437/41; 437/21; 437/27; 437/909
[58] Field of Search ............... 148/DIG. 157; 437/40, 437/41, 21, 27, 38, 44, 74, 75, 909

[56] References Cited

U.S. PATENT DOCUMENTS

| | | | |
|---|---|---|---|
| 4,373,254 | 2/1983 | Blumenfeld | 437/21 |
| 4,437,225 | 3/1984 | Mizutani | 437/21 |
| 4,965,213 | 10/1990 | Blake | 437/21 |
| 5,047,356 | 9/1991 | Li et al. | 437/34 |

FOREIGN PATENT DOCUMENTS

| | | | |
|---|---|---|---|
| 0031552 | 2/1983 | Japan | 437/21 |
| 1-158775 | 6/1989 | Japan | |
| 0084718 | 3/1990 | Japan | 437/21 |

OTHER PUBLICATIONS

Ratnan, "Novel Silicon-on-Insulator MOSFET for High-Voltage Integrated Circuits", Electronics Letters, Apr. 13, 1989, vol. 25, No. 8, pp. 536–537.

*Primary Examiner*—George Fourson
*Assistant Examiner*—Richard A. Booth
*Attorney, Agent, or Firm*—Paul R. Miller

[57] ABSTRACT

The present invention is directed to a method and thin film transistor having a linear doping profile between the gate and drain regions. This is constructed in a particular manner in order to achieve a thin film transistor having a significantly high breakdown voltage of the order of 700 to 900 volts, much greater than that achieved in the prior art.

11 Claims, 6 Drawing Sheets

HIGH VOLTAGE THIN FILM TRANSISTOR HAVING A LINEAR DOPING PROFILE AND METHOD FOR MAKING

This is a continuation of application Ser. No. 07/650,391, filed Feb. 1, 1991 now abandoned.

The present invention involves the structure of a high voltage, thin film semiconductor device and method for making such device. In particular, the present invention sets forth such a structure and technique for making this structure in which a specific doping density profile is provided in the structure. This doping profile is linear and enables significantly increased breakdown voltages to be achieved.

BACKGROUND OF THE INVENTION

The instant invention relates to integrated circuit devices which are particularly adapted for high voltage applications. The invention particularly relates to integrated circuit devices which are manufactured by the use of semiconductor-on-insulator (SOI) technology and which devices exhibit improved voltage breakdown properties.

A major problem in high voltage integrated circuit technology is to find a satisfactory solution for the problem of isolation of components and subcircuit sections.

The usual method of electrically isolating components within an integrated circuit and, more particularly, within a power integrated circuit (PIC) or a high voltage integrated circuit (HVIC) is by what is called "junction isolation". In such a method p-type diffusions may be used to isolate various devices formed in a n-type epitaxial layer on top of a silicon substrate. Such a method is described in Rumennik, IEEE Spectrum, Vol. 22, pp. 42–48, July 1985.

Another method of electrical isolation of such components is the so-called "dielectric isolation". In this method, an electrically-insulating material, such as silicon dioxide is used to isolate the individual components such as devices operating at very different electrical potentials. SOI technology when the semiconductor is silicon and the insulator is silicon dioxide (hereinafter referred to as "oxide") is an example of a dielectric isolation method. In this technology the devices are built in a layer of silicon, approximately 0.1–2 $\mu$m thick which is separated from the silicon substrate by a dielectric layer such as silicon oxide typically 0.1–5 $\mu$m thick.

Several methods are known for producing the SOI starting material. In one of these methods "SIMOX", silicon oxide is formed by ion implantation of oxygen ions into a silicon wafer.

In another method, zone-melt-recrystallized (ZMR) material is prepared by depositing a polycrystalline silicon layer over an oxide-coated silicon wafer and converting the polycrystalline silicon into a monocrystalline silicon film by irradiating the polycrystalline silicon with a power source such as a laser or a graphite-strip heater.

Another method is the bonding and etchback or direct bonding method in which two oxide-coated silicon wafers are joined together to form a strong bond and one of these wafers is thinned to the desired thickness.

Figure 4A:
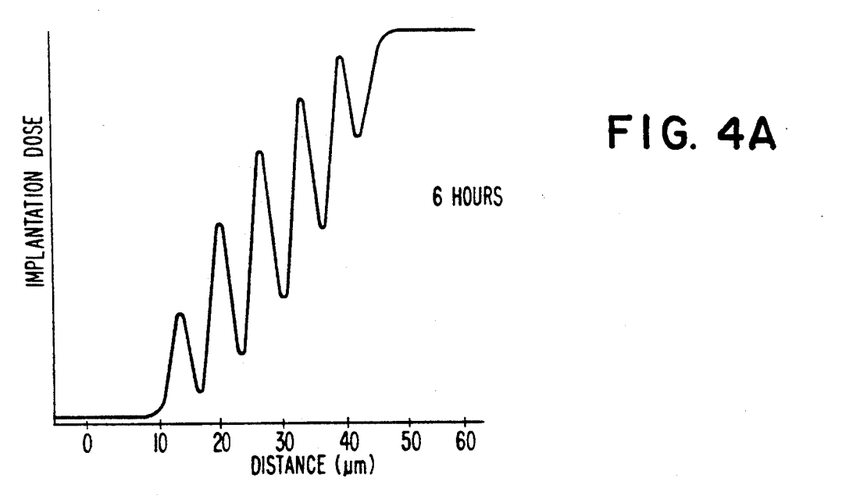
FIGS. 4A, 4B, 4C, 4D and 4E illustrate the linear doping profile following annealing for various periods of time to form the present invention.
Figure 4B:
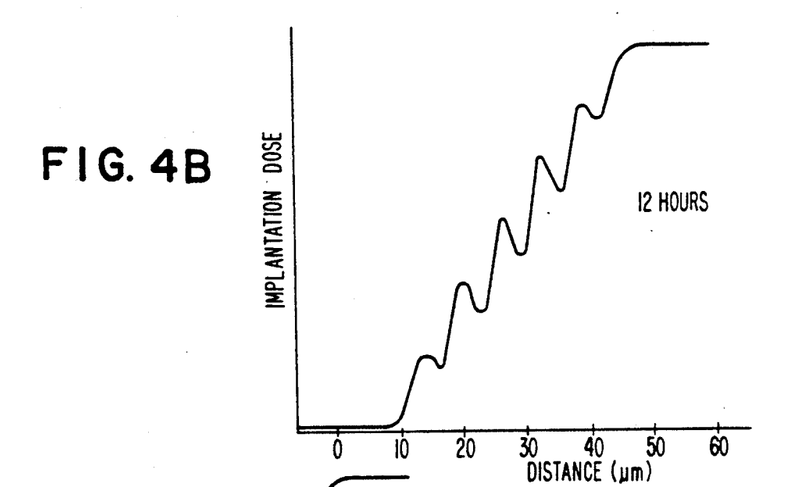
Figure 4C:
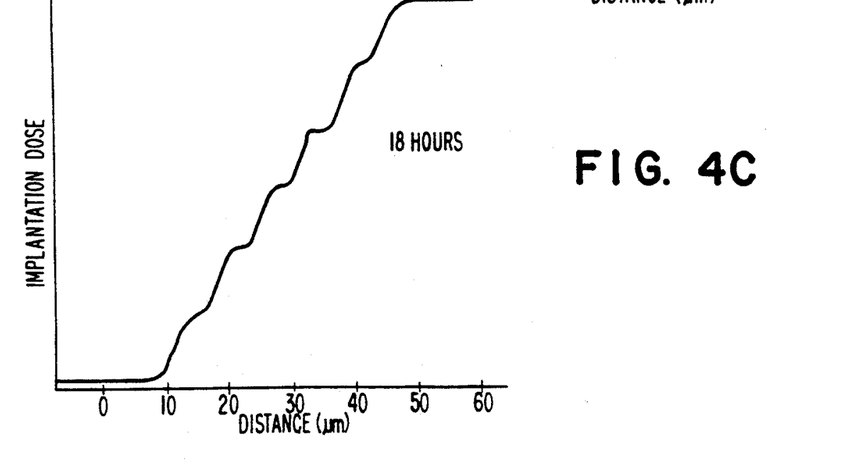
Figure 4D:
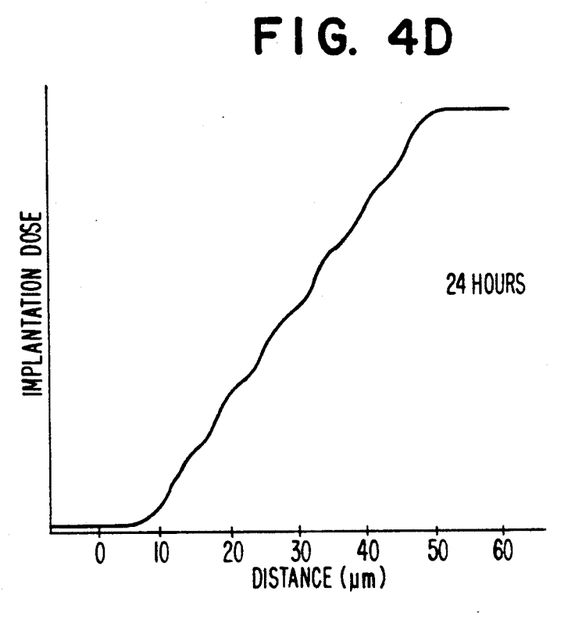

Lateral transistor structures for high voltage applications may be seen by way of a lateral n-channel DMOS (LDMOS) transistor, such as that seen in the article by Rumennik, IEEE Spectrum, Volume 22, July, 1985, pages 42–48. In this article, discussing power integrated circuits, the arrangement of a lateral double-diffused MOS transistor is illustrated in FIG. 4C. It is noted that such lateral MOS transistor enables epitaxial layer thicknesses much smaller than those of vertical devices, and that increasing the distance between the source and drain leads to an increase in the breakdown voltage.

The use of nominally high voltage thin film structures has been previously discussed in the art. For example, the Tuan, U.S. Pat. No. 4,752,814, discusses high voltage thin film transistors using amorphous silicon. In such a structure, a gate electrode and source electrode are vertically superimposed while a drain electrode is displaced laterally from both although at a different vertical level with respect to each. An undoped or lightly doped amorphous silicon layer is provided between the source and drain electrodes to conduct current to the drain electrode under control of the gate electrode. A second gate electrode, also vertically below the first gate electrode and extending laterally closer toward the drain electrode, is provided to increase breakdown voltage. However, the patent is completely silent as to the amount of breakdown voltage.

Several methods have been proposed for improving the breakdown voltage of devices formed in the SOI material.

An offset-gate SOI MOS transistor is described in C. I. Drowley et al (Mat. Res. Symp. Proc., Vol. 33, p. 133, 1984). This article indicates that with the structure shown a breakdown voltage of 38V is achieved.

A method of increasing the breakdown voltage that applies specifically to SIMOX devices is shown in S. Nakashima, IEEE Transactions on Electron Devices, Volume ED-33, No. 1, January, 1986, pages 126–132. By this technique, only a moderately high breakdown voltage is achieved, generally of about 180V.

In each of these prior art structures forming the background to the present invention, various problems and difficulties occur. Especially high breakdown voltages have not been obtained in the prior art.

SUMMARY OF THE INVENTION

The problems arising in the prior art have been solved by a structure and technique according to the present invention. Namely, it has been found that the provision of a specific doping density profile in the drift region between the gate electrode and drain electrode of a lateral field effect transistor enables significant increases in the breakdown voltage, especially for very thin (<1 micron) SOI films.

Accordingly, the present invention enables the manufacture of high voltage thin film transistors having very high breakdown voltages. This is obtained in the present invention in the manufacture of the transistor by implanting ions into a thin layer of silicon through a plurality of openings of a mask having different opening widths to form a plurality of doped regions of different widths, and thereafter, annealing the structure to form a linear doping profile from the plurality of doped regions over a lateral distance of the thin layer of silicon. The carrying out of these steps enables the formation of high voltage thin film transistors, particularly of a SOI type, in which a thin layer of silicon having a linear doping profile is provided between a source electrode and a drain electrode displaced laterally from the source electrode at an opposite end of the thin layer of silicon.

The method of obtaining this semiconductor is carried out so that the linear doping profile has a minimum doping value at one end of the lateral distance of the thin film of silicon and a maximum doping value at a second opposite end of the lateral distance of the thin layer of silicon. The linearity of the doping profile is achieved by the time of annealing of the structure, which time can range from at least 12 to about 36 hours. The annealing is carried out at a temperature of approximately 1150° C.

Such a linear doping profile enables increased breakdown voltage ranging from about 700 volts to about 900 volts, significantly larger than that achieved in the prior art. The lateral distance of the thin layer of silicon over which this doping density occurs may be formed to be at least 40 to 50 microns. Moreover, the linear doping profile may be formed with an effective implantation dose given by the formula $$Q(X) = Q(O) + (X/L)Q_{max}$$

where Q(X) is the doping concentration times the SOI thickness at X, X is the lateral distance along the drift region, L is the length of the drift region, Q(0) is a constant equaling about $10^{11}/cm^2$, and $Q_{max}$ is a constant equaling about $5 \times 10^{12}$ to $2 \times 10^{13} cm^2$.

BRIEF DESCRIPTION OF THE DRAWING FIGURES

The invention will be described in detail, by way of example, with reference to the drawing figures. Therein.

Similar reference numbers are used to identify corresponding parts of respective drawings. However, in order to aid and clarify the descriptions, various thicknesses are shown differently in different drawings.

DESCRIPTION OF THE INVENTION

Figure 1A:
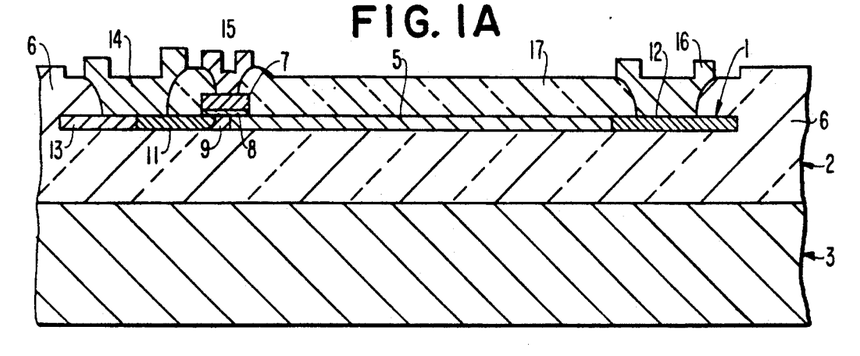
FIG. 1A illustrates a thin film transistor according to the present invention.

FIG. 1A is a cross section of a high voltage SOI LDMOS transistor made according to the present invention. Although a high-voltage LDMOS is described here, the same principle can be applied to other high voltage devices and high-voltage integrated circuit components, such as lateral diodes and lateral insulated-gate bipolar transistors (LIGBT). For example, in the case of a diode, the gate 7, gate oxide 8 and the body region 9 seen in FIG. 1A are omitted; in the case of the LIGBT, a suitable minority carrier injector is included adjacent to the drain region 12.

In the LDMOS structure shown in FIG. 1A, a buried layer of silicon dioxide 2, for example, is provided on a silicon substrate 3. The silicon substrate 3 may be either of the n-conductive type or the p-conductive type. A thin film silicon layer 1 is provided on the buried layer 2 of silicon oxide.

This thin layer of silicon 1 is formed with a linear doping profile between the polysilicon gate 7 and its underlying gate oxide 8 to the drain region 12 and aluminum drain contact 16. In particular, the linear doping profile is formed with an effective dose given by the general relationship $$Q(X) = Q(O) + (X/L)Q_{max}$$

where Q(X) is the doping concentration times the SOI layer thickness at a position X along the lateral distance of the linear doping region 5, L is the length of the lateral distance, and the numbers Q(0) and $Q_{max}$ set forth given values of concentration times SOI thickness. For example, Q(0) may equal $10^{11}/cm^2$ while $Q_{max}$ may equal to $5 \times 10^{12}$ to $2 \times 10^1/cm^2$. This doping profile forms a transistor with a significantly increased breakdown voltage ranging from about 700 volts to about 900 volts, for example.

Figure 1B:
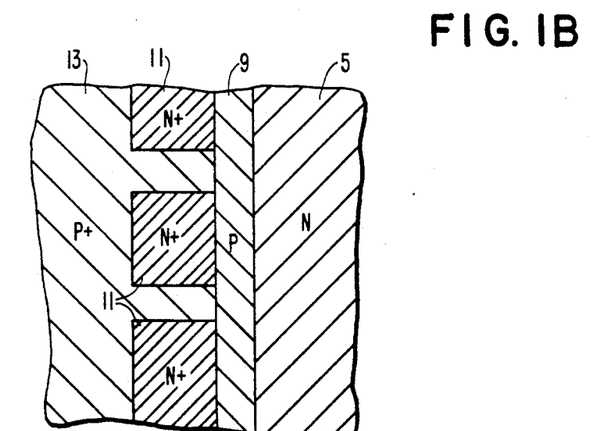
FIG. 1B shows a partial plan view of the source and body regions of the transistor in FIG. 1A.

The transistor structure illustrated in FIGS. 1A and 1B includes a source region 11 of one conductivity type having a source contact 14 of aluminum at the side of the gate electrode region 7, 8. A body region 9 of a second conductivity type extending from a region 13 at the end of the source region is also provided. It is noted that the region 13, also of the second conductivity type, makes contact with the region 9 since the source region 11 is segmented in the plane perpendicular to the page of FIG. 1A. This is illustrated in FIG. 1B.

The source region 11 and the drain region 12 may each be of an n+ conductivity type, while the regions 9 and 13 may be of a p and p+ conductivity type, respectively.

A gate contact 15 also of aluminum is provided to form the thin film transistor structure along with the source contact 14 and drain contact 16,. An oxide region 17 of, for example, silicon dioxide, is formed over the thin film silicon layer 1 and particularly between the electrode contacts 14, 15 and 16.

This structure of FIG. 1 may be manufactured as an example of a lateral MOS transistor, as follows. The starting SOI layer 1, obtained by any of the standard techniques described above, such as, for example, zone-melting recrystallization or direct bonding, is formed on the silicon substrate 3, with a buried oxide layer 2 interposed between the substrate 3 and the SOI layer 1. The silicon substrate 3 may be either n-type or p-type. The thin layer of silicon 1, called the SOI layer, has a thickness of about 2000–3000 angstroms and a resistivity greater than 0.1 Ohm cm. It may be either of the n-type or the p-type, but will be described of the n-type for this example. The buried oxide layer has a thickness of 2 microns, but this may be varied, as will be seen hereinafter.

Figure 2A:
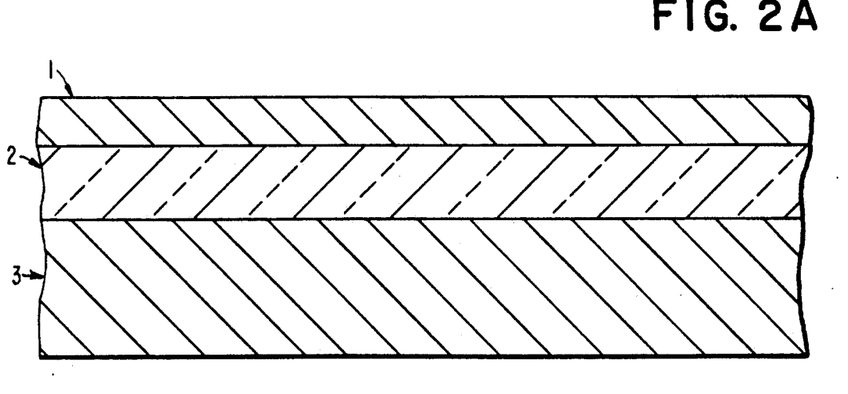
FIGS. 2A, 2B, 2C, 2D, 2E and 2F illustrate various stages in the manufacture of the semiconductor device of FIG. 1.
Figure 2B:
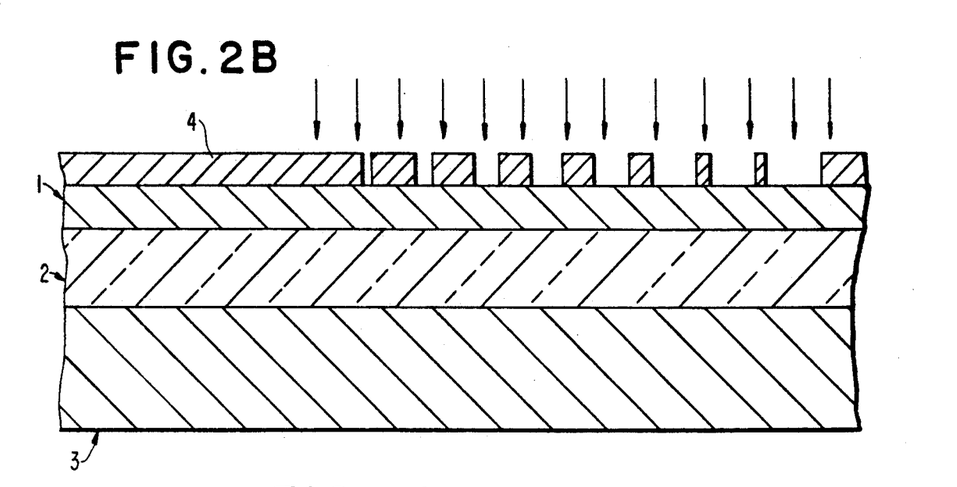
Figure 2C:
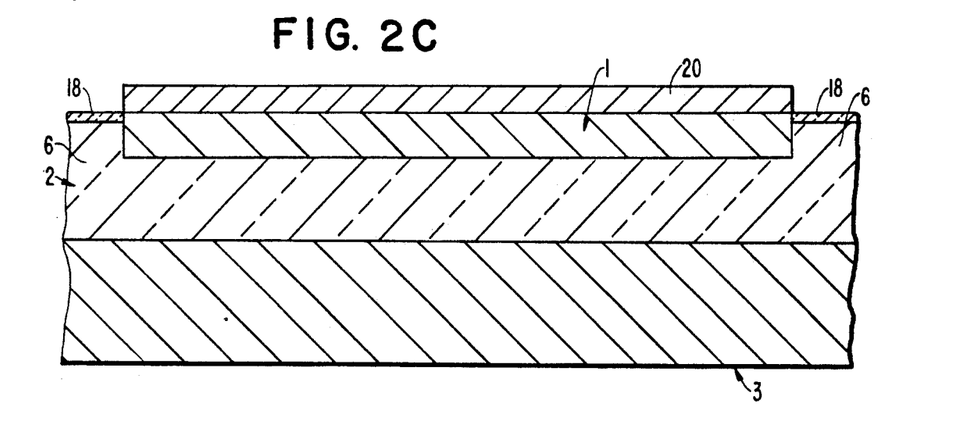

The distance 5 of the linear doping profile in FIG. 1 is formed by providing a mask 4 onto the SOI layer 1 as seen in FIG. 2B. The mask 4 may be formed by a photoresist layer patterned photolithographically by a standard technique. Thereafter, phosphorus ions are implanted at an energy of 100 KeV and ion dose of about $2 \times 10^{13}/cm^2$. The photoresist mask 4 is provided with eight openings of varying dimensions to enable the phosphorus ions to be implanted into the silicon layer 1 at various amounts. These eight openings have a different lateral dimension with the dimension increasing, for example, in FIG. 2B from left to right. As an example, the lateral dimension of the first opening is 1 micron, the lateral dimension of the second opening is 2 microns, the lateral dimension of the third opening is 3 microns, etc.

After this ion implantation is carried out, the photoresist layer 4 is removed, the wafer is capped with a 1400 angstrom thick silicon nitride layer 18, and annealed. The annealing may be carried out for various time periods, as will be discussed hereinafter, at about 1150° C. The time period, as may be seen by reference to FIGS. 4A-4E, must be greater than about 18 hours to assure a monotonic increase in doping concentration from left to right, but less than about 36 hours. This combination of mask, ion implant, and anneal assures the approximate linear variation of phosphorus doping in the silicon layer 1 over a lateral distance, such as a the linear doping region 5 seen in FIG. 1. The linear variation of phosphorus doping, for example, may be over a lateral distance of about 72 microns, i.e. from 8 microns from the left of the first opening (smallest) of the layer 4 in FIG. 2B to 8 microns to the right of the largest or eighth opening in the layer 4 in FIG. 2B. This linear lateral doping profile is the key feature responsible for the improved breakdown voltage values achieved according to the present invention.

A photoresist mask 20 is formed over the linearly doped region, and silicon nitride 18 left from the previous step of capping and annealing is removed from the region 6 by reactive ion etching. After the photoresist layer 20 is removed, the wafer is thermally oxidized in steam at about 975° C. for 170 minutes. This assures conversion of the silicon in the region 6 to silicon dioxide while keeping the thin device region 1 silicon. Chemical etching away of any remaining silicon nitride completes this step.

Figure 2D:
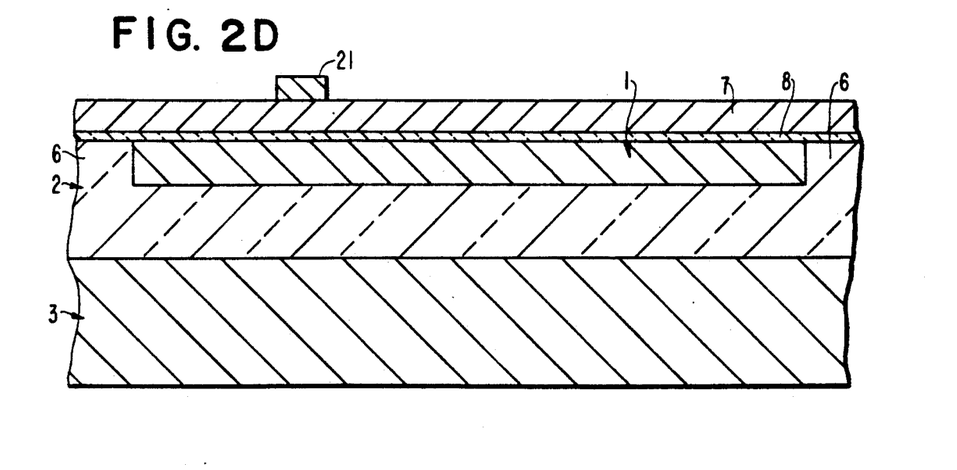
Figure 2E:
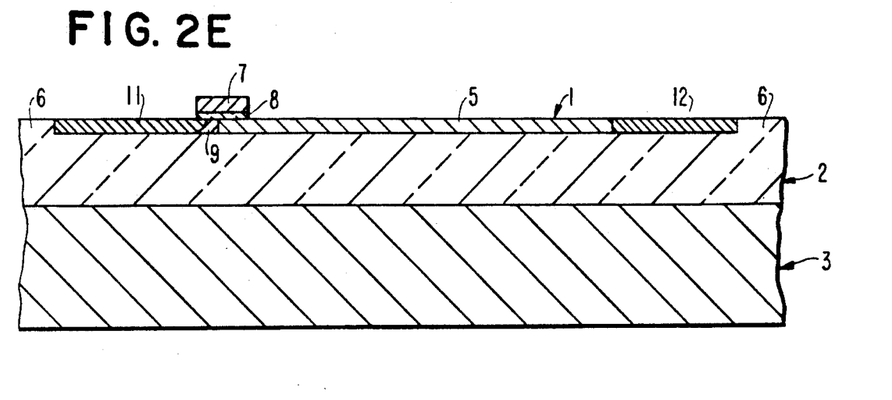

A 600 angstrom thick gate oxide layer 8 is grown over the surface as seen in FIG. 2d and a layer of polysilicon for a gate region 7 is formed thereon. A photoresist mask 21 is provided on the polysilicon layer to form the gate region 7 and underlying oxide region 8 as seen in FIG. 2E. The layer of polysilicon is approximately 5000 angstrom thick and the unmasked portion of this polysilicon layer is removed by reactive ion etching. The photoresist mask 21 is then removed.

A P-body region 9, such as seen in FIG. 1B, is formed by implanting boron ions at an energy of 40 KeV and dose of about $9.6 \times 10^{12}/cm^2$ in the region 9, for example, using a photoresist mask (not shown). This photoresist mask is positioned such that the implantation is self aligned to the polysilicon gate 7. After stripping this photoresist, the wafer is annealed at 1100° C. for 340 minutes to drive boron to the buried oxide layer 2 and form a channel region 10 of about 1.5 micron width.

Thereafter, the source region 11 and drain region 12 are formed by implanting arsenic ions with an energy of 190 KeV at a dose of $7.5 \times 10^{15}/cm^2$. This is carried out at the source and drain regions using a photoresist mask (not shown). The arsenic ions provide a N+ source 11 and drain 12. After stripping the photoresist, the wafer is annealed at 950° C. for approximately 1 hour in such a way that 300 angstroms of silicon dioxide (not shown) grow on the polysilicon gate 7 to insulate it. The P+ region 13 is then formed by implanting boron ions at an energy of 30 KeV and dose of $4 \times 10^{15}/cm^2$ in the region 13 illustrated in FIGS. 1A and 1B. Again, a photoresist mask (not shown) is used and subsequently stripped.

The P+ region 13 contacts the P body region 9 within segments of the source region 11 which is segmented in the plane perpendicular to the page of FIG. 1A. A plan view of this segmentation is shown in FIG. 1B.

Figure 2F:
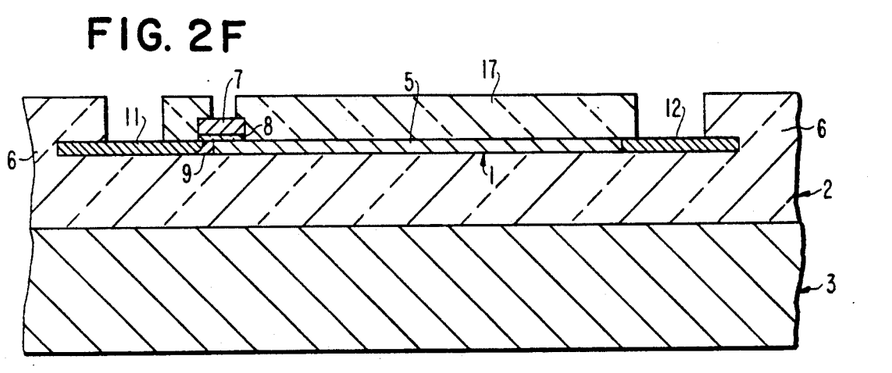

A silicon dioxide layer 17 having about 8 percent phosphorus is deposited onto the wafer at a thickness of about 1.3 microns. This layer is masked with a photoresist (not shown) to expose only regions where the aluminum contacts are desired to the source region 11, gate region 7 and drain region 12. This is seen in FIG. 2F wherein appropriate openings to these transistor regions are shown in the oxide layer 17. The openings to the regions 11, 7, and 12 are provided by reactive ion etching and thereafter the photoresist is stripped. The wafer is annealed at approximately 1000° C. for 30 minutes to smooth the as etched silicon dioxide layer 17 to allow better aluminum coverage. Any residual silicon dioxide is removed from the contact areas and a 1.2 micron layer of aluminum having 1 percent silicon and a resistance of 25 ohm per square is deposited. By appropriate masking, the regions 14, 15 and 16 are formed by reactive ion etching. The wafer is alloyed at 470° C. for 30 minutes after stripping the masking.

A final step of this method involves the deposition of a protective layer (not shown) of silicon dioxide having a 6 percent phosphorus doping, for example, at a thickness of 1.2 microns. Pad areas can be provided to make external electrical connections to the several electrodes 14, 15 and 16.

Figure 3:
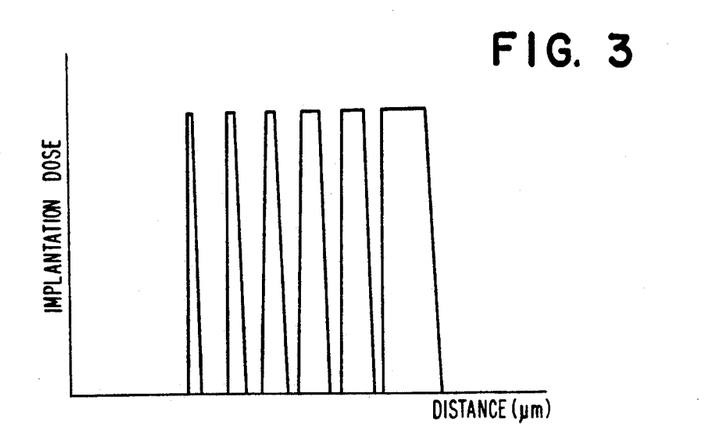
FIG. 3 shows the ion implantation dose profile applied to the silicon layer during the manufacture of the present invention.

As indicated above, the lateral openings in the photoresist mask layer 4 in FIG. 2B have varying distances. This enables the effective implantation dose to vary according to the opening size, as seen in FIG. 3, for example.

Figure 4E:
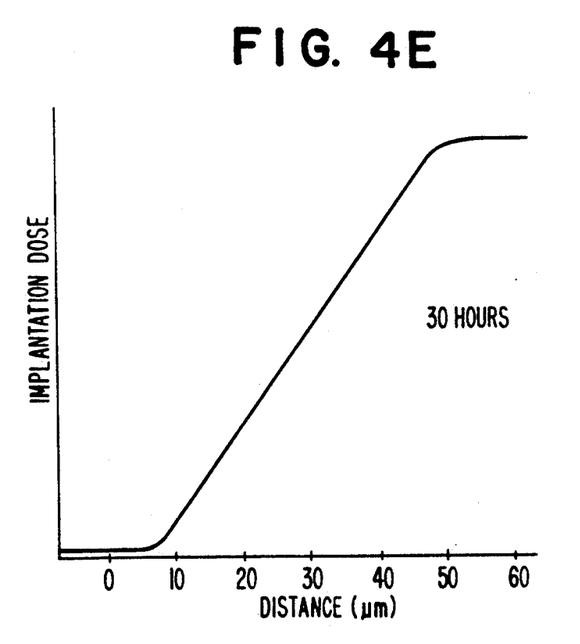

FIGS. 4A-4E illustrate the lateral doping according to present invention upon annealing for various time periods. As may be seen in FIG. 4A and 4B, annealing times of 6 and 12 hours provide a highly stepped variation of the lateral doping region. For about 18 and 24 hours of annealing in FIGS. 4C and 4D, the doping becomes relatively linear over the distance of the linear doping profile. FIG. 4E shows a completely linear doping profile upon annealing for at least 30 hours and the linearity improves with annealing times greater than 30 hours, such as up to 36 hours.

Figure 5:
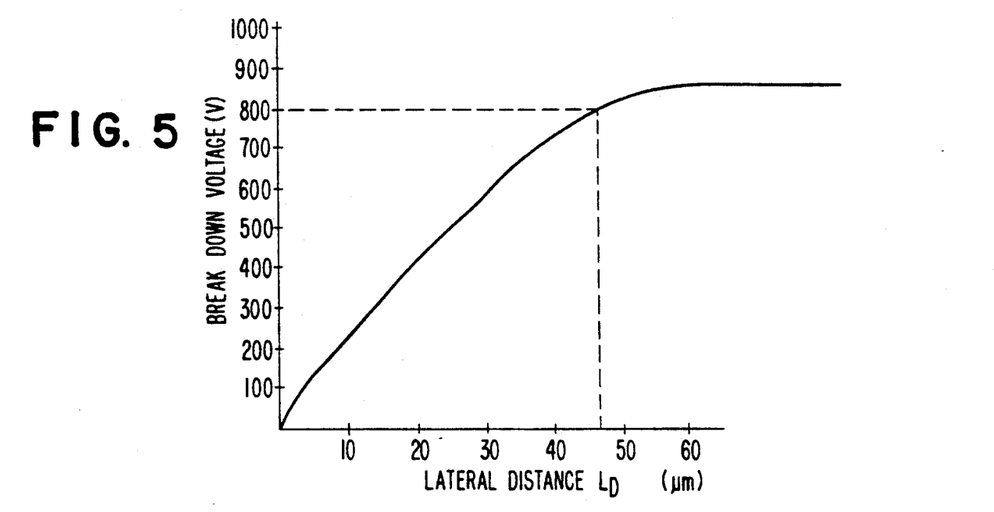
FIG. 5 shows the breakdown voltage relative to the lateral distance along the drift region in the present invention.

This process yields a thin film transistor semiconductor device having a breakdown voltage ranging from 700 to 900 volts where the drift length $L_D$, defined as the lateral distance between the polysilicon gate 7 and the N+ drain 12 in FIG. 1A, is at least 40-50 microns. FIG. 5 illustrates this breakdown voltage versus the lateral distance $L_D$ in microns for a silicon film thickness of 1000 angstroms and buried oxide thickness of 2 microns. As may be seen for a distance between 40 and 50 microns, the breakdown voltage is approximately 800 volts.

Figure 6:
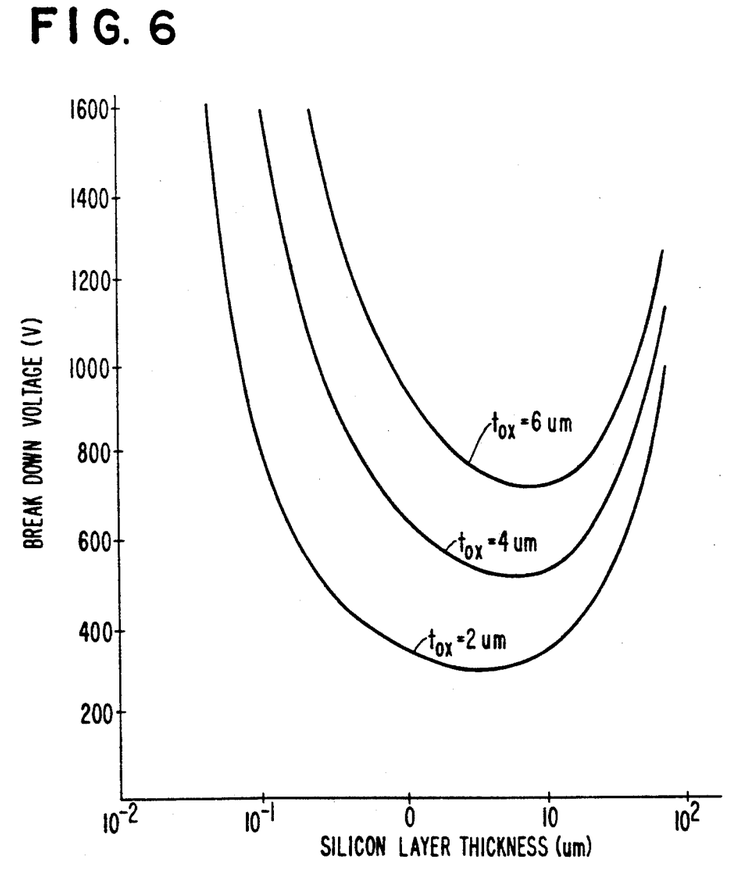
FIG. 6 illustrates the variation of the breakdown voltage relative to the silicon layer thickness for different oxide thicknesses of the buried oxide layer.

FIG. 6 illustrates a variation of the breakdown voltage V relative to the silicon layer thickness in microns for variations of the thickness of the buried oxide layers. For a given buried oxide thickness, and for silicon layer thicknesses below about 1 micron, the breakdown voltage increases with decreasing silicon thickness. This is a new effect achieved in thin silicon layers with thin buried oxide layers. The present invention thus enables the achievement of high breakdown voltages in devices formed in very thin SOI films, with relatively thin buried oxides. The use of thin SOI layers has the advantage of enabling high-speed devices with high breakdown voltages and greater simplicity of isolating individual integrated circuit components. The use of relatively thin buried oxide layers provides improved thermal dissipation, which is an important consideration in high-voltage and power devices and integrated circuits.

What is claimed:

1. In a method of manufacturing high voltage thin film transistors the steps comprising
   (a) providing a thin layer of monocrystalline silicon over an oxide layer on a silicon substrate,
   (b) decreasing resistivity of said thin layer of silicon by uniformly introducing impurities into said thin layer of silicon,
   (c) forming a mask over said thin layer of silicon, said mask having a plurality of openings, each of said openings laterally increasing in dimension from that of a proceeding opening,
   (d) introducing impurities into said thin layer of silicon through said plurality of openings to form a plurality of doped regions of different width,
   (e) removing said mask, capping said thin layer of silicon with silicon nitride, and annealing to form a linear doping profile from said plurality of doped regions over a lateral distance of said thin layer of silicon, wherein said linear doping profile is formed with a minimum doping concentration at one end of said lateral distance and a maximum doping concentration at a second opposite end of said lateral distance,
   (f) removing said silicon nitride at regions beyond edges of said lateral distance, thermally oxidizing exposed areas of said thin layer of silicon, and thereafter removing remaining portions of said silicon nitride, and
   (g) forming a structure with said thin layer of silicon having said linear doping profile.

2. A method according to claim 1, wherein said annealing is carried out for a time ranging from 18 to 36 hours.

3. A method according to claim 2, wherein said annealing is carried out at a temperature of approximately 1150° C.

4. A method according to claim 1, wherein said linear doping profile is formed with an effective dose given by $$Q(X) = Q(O) + (X/L)Q_{max},$$

where $Q(X)$ is the doping concentration times the thickness of said thin layer of silicon at X, X is the distance along said lateral distance, L is the length of said lateral distance, $Q(0)$ equals $10^{11}/cm^2$, and $Q_{max}$ equals $5 \times 10^{12} - 2 \times 10^{13}/cm^2$.

5. A method according to claim 1, wherein said lateral distance is formed to be at least 40–50 μm.

6. A method according to claim 4 wherein said step (g) is carried out to form a transistor structure by the steps of
   (i) forming a polysilicon gate region over said thin layer at said one end of said lateral distance,
   (ii) forming a source region in said thin layer at a side of said gate region opposite to said linear doping profile,
   (iii) forming a drain region at said second opposite end of said lateral distance of said linear doping profile, and
   (iv) forming electrical contacts to said source region, said gate region, and said drain region.

7. A method according to claim 1, wherein said step (b) is carried out by implanting ions.

8. A method according to claim 1, wherein said step (d) is carried out by implanting ions.

9. A method according to claim 8, wherein phosphorous ions are implanted an energy of about 100 keV and at an ion dose of about $2 \times 10^{13}/cm^2$.

10. A method according to claim 6, wherein said concentration forms an increased breakdown voltage of said transistor structure ranging from about 700 V to about 900 V.

11. A method according to claim 10, wherein said increased breakdown voltage of said transistor structure is formed to approximately 800 V.

* * * * *